United States Patent
Artur et al.

(10) Patent No.: US 12,057,163 B2
(45) Date of Patent: Aug. 6, 2024

(54) READ REFERENCE CURRENT GENERATOR

(71) Applicant: Samsung Electronics Co., Ltd., Suwon-si (KR)

(72) Inventors: Antonyan Artur, Suwon-si (KR); Jieun Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 129 days.

(21) Appl. No.: 17/824,818

(22) Filed: May 25, 2022

(65) Prior Publication Data
US 2023/0005536 A1    Jan. 5, 2023

(30) Foreign Application Priority Data
Jun. 30, 2021 (KR) ............... 10-2021-0085879

(51) Int. Cl.
*G11C 13/00* (2006.01)
(52) U.S. Cl.
CPC ...... *G11C 13/0038* (2013.01); *G11C 13/0004* (2013.01); *G11C 13/0026* (2013.01)
(58) Field of Classification Search
CPC ............ G11C 11/1673; G11C 11/4074; G11C 11/4076; G11C 11/4085; G11C 11/4091; G11C 11/4094; G11C 13/0004; G11C 13/0026; G11C 13/0038; G11C 16/02; G11C 16/0408; G11C 16/24; G11C 16/26; G11C 16/28; G11C 7/062; G11C 7/12; G11C 11/1655; G11C 11/1659; G11C 11/1697; G11C 11/2255; G11C 13/004; G11C 2013/0045; G11C 2013/0054; G11C 2029/5006; G11C 29/021; G11C 29/025; G11C 29/028; G11C 5/147; G11C 7/04

See application file for complete search history.

(56) References Cited

U.S. PATENT DOCUMENTS

| | | | |
|---|---|---|---|
| 6,590,372 B1 | 7/2003 | Wiles, Jr. | |
| 8,665,007 B2 | 3/2014 | Ochoa et al. | |
| 2010/0123514 A1 | 5/2010 | Le et al. | |
| 2011/0080773 A1 | 4/2011 | El Baraji et al. | |
| 2013/0015834 A1 | 1/2013 | Glibbery | |
| 2014/0266119 A1 | 9/2014 | Burton et al. | |
| 2014/0269030 A1 | 9/2014 | Chih et al. | |
| 2020/0327921 A1* | 10/2020 | Takeda | G11C 11/4091 |

* cited by examiner

*Primary Examiner* — Thong Q Le
(74) *Attorney, Agent, or Firm* — Harness, Dickey & Pierce, P.L.C.

(57) ABSTRACT

A read reference current generator includes a temperature coefficient (TC) controller configured to adjust a temperature coefficient in response to a first control signal and generate a read reference current having an adjusted temperature coefficient, a plurality of replica circuits configured to receive the read reference current and adjust an absolute value of the read reference current with different scale factors to generate a plurality of branch currents, and a plurality of switches configured to control connection of the TC controller and the plurality of replica circuits in response to a second control signal, wherein an equivalent resistance value of each of the plurality of replica circuits corresponds to a multiple of an equivalent resistance value of a data read path, and the data read path includes a selected memory cell and a clamping circuit clamping a voltage level of a selected bit line to a determined value.

20 Claims, 17 Drawing Sheets

| CTRL | PMOS | bCTRL | bPMOS |
|---|---|---|---|
| Trim<0> | $I0 = a(Temp-25°C)+k$ | Trim b<0> | $bI0 = -a(-25°C)+k$ |
| Trim<1> | $I1 = 2a(Temp-25°C)+2k$ | Trim b<1> | $bI1 = -2a(-25°C)+2k$ |
| Trim<2> | $I2 = 4a(Temp-25°C)+4k$ | Trim b<2> | $bI2 = -4a(-25°C)+4k$ |

READ REFERENCE CURRENT GENERATOR

CROSS-REFERENCE TO RELATED APPLICATION(S)

This application claims benefit of priority to Korean Patent Application No. 10-2021-0085879 filed on Jun. 30, 2021 in the Korean Intellectual Property Office, the disclosure of which is incorporated herein by reference in its entirety.

BACKGROUND

The present inventive concepts relate to a read reference current generator.

Next-generation memory devices that are non-volatile and do not require refresh have been researched in accordance with demand for semiconductor memory devices having higher capacity and/or consuming less power. Such next-generation memory devices include a phase change random access memory (PRAM) using a phase change material, a resistive random access memory (RRAM) using a material having variable resistance characteristics such as a transition metal oxide, a magnetic random access memory (MRAM) using a ferromagnetic material, etc. One of the common features of materials constituting memory cells in next-generation memory devices is that a resistance value varies according to a state in which a current or voltage is applied.

SUMMARY

An aspect of the present inventive concepts is to provide a read reference current generator in which a size of a temperature coefficient (TC) controller for controlling a temperature coefficient of a maximum bit line current is reduced.

According to an aspect of the present inventive concepts, a read reference current generator includes: a temperature coefficient (TC) controller configured to adjust a temperature coefficient in response to a first control signal and generate a read reference current having an adjusted temperature coefficient; a plurality of replica circuits configured to receive the read reference current and adjust an absolute value of the read reference current with different scale factors to generate a plurality of branch currents; and a plurality of switches configured to control connection of the TC controller and the plurality of replica circuits in response to a second control signal, wherein an equivalent resistance value of each of the plurality of replica circuits corresponds to a multiple of an equivalent resistance value of a data read path, and the data read path includes a selected memory cell and a clamping circuit clamping a voltage level of a selected bit line to a determined value.

According to another aspect of the present inventive concepts, a read reference current generator includes: a first TC controller configured to adjust a temperature coefficient in response to a first control signal and generate a first read reference current having an adjusted temperature coefficient; a plurality of second TC controllers configured to generate second read reference currents having different absolute values and different temperature coefficients in response to a second control signal; a replica circuit configured to determine a voltage level of a selected bit line to a constant voltage level; and a plurality of switches configured to control connection of the plurality of second TC controllers and the replica circuit in response to a third control signal.

According to another aspect of the present inventive concepts, a read reference current generator includes: a TC controller configured to adjust a temperature coefficient in response to a first control signal and generate a first read reference current having an adjusted temperature coefficient; a plurality of current sources configured to generate second read reference currents having different absolute values in response to a second control signal; a replica circuit configured to determine a voltage level of a selected bit line to a constant voltage level; and a plurality of switches configured to control connection of the plurality of current sources and the replica circuit in response to a third control signal.

According to another aspect of the present inventive concepts, a read reference current generator includes: a first TC controller configured to adjust a temperature coefficient in response to a first control signal and generate a first read reference current having an adjusted temperature coefficient; a plurality of second TC controllers configured to adjust a temperature coefficient in response to the first control signal and generate second read reference currents having an adjusted temperature coefficient; a replica circuit configured to determine a voltage level of a selected bit line to a constant voltage level; and a plurality of switches configured to control connection of the plurality of second TC controllers and the replica circuit in response to a third control signal.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Hereinafter, example embodiments of the present inventive concepts will be described with reference to the accompanying drawings.

Figure 1:
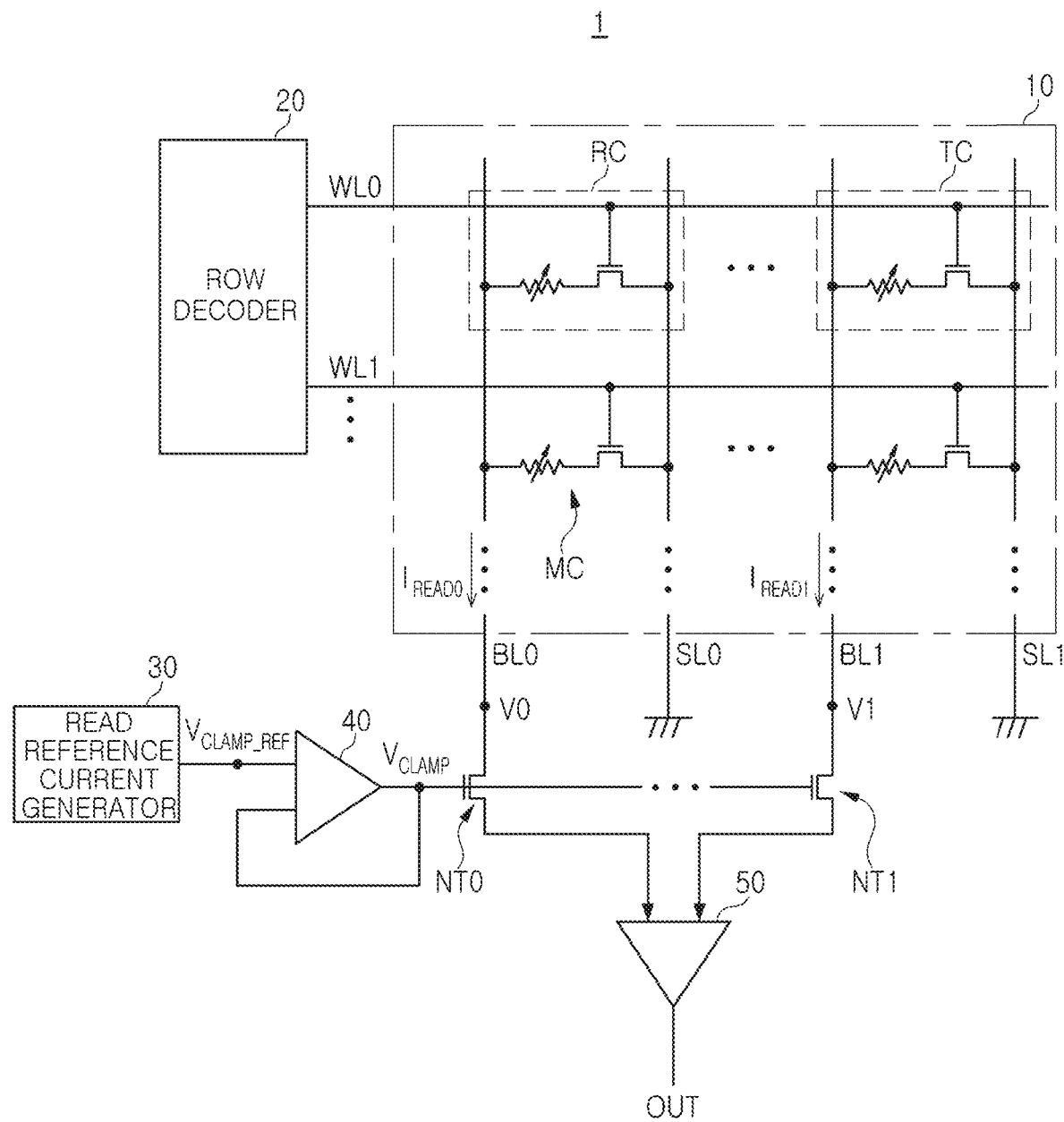
FIG. 1 is a diagram illustrating a memory device according to example embodiments of the present inventive concepts.
Figure 2:
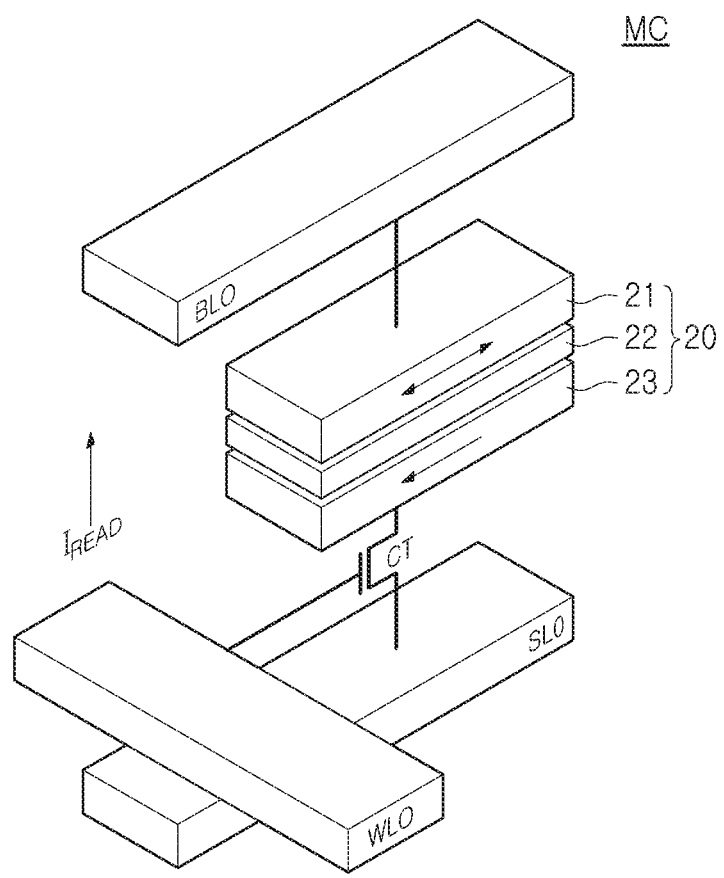
FIG. 2 is a configuration diagram of a spin transfer torque (STT)-magnetoresistive random access memory (MRAM) as an example embodiment of a memory cell applied to FIG. 1.

FIG. 1 is a diagram illustrating a memory device according to example embodiments of the present inventive concepts, and FIG. 2 is a configuration diagram of a spin transfer torque (STT)-magnetoresistive random access memory (MRAM) as an example embodiment of a memory cell applied to FIG. 1.

Referring to FIG. 1, a memory device 1 may include a memory cell array 10, a row decoder 20, a read reference current generator 30, a buffer 40, and/or a sense amplifier 50.

The memory device 1 may be a resistive switching memory device. Each memory cell constituting the memory cell array 10 may include one variable resistance element and one switching element, and when the variable resistance element includes an upper electrode of a magnetic material, a lower electrode of a magnetic material, and a dielectric material interposed therebetween, the memory device 1 may be an MRAM. In example embodiments of the present inventive concepts, the MRAM is mainly illustrated and described for convenience of description, but the technology of the present inventive concepts may also be applied to a PRAM, an RRAM, any other resistance varying memory, and/or the like.

The memory cell array 10 may include a plurality of memory cells MC respectively arranged at intersections of a plurality of word lines WL0 and WL1 and a plurality of bit lines BL0 and BL1. For example, the memory cell MC may be an STT-MRAM cell including one switching element and one magnetic tunnel junction (MJT) element. Referring to FIG. 2 illustrating an implementation example of the STT-MRAM, the memory cell MC may include an MTJ element 20 and a selection transistor CT. A gate of the selection transistor CT may be connected to a word line (e.g., a first word line WL0), and one electrode of the selection transistor CT may be connected to a bit line (e.g., a first bit line BL0) through the MJT element 20. Also, the other electrode of the selection transistor CT may be connected to a source line (e.g., a first source line SL0). The MTJ element 20 may include a fixed layer 23, a free layer 21, and a tunnel layer 22 formed therebetween. A magnetization direction of the fixed layer 23 is fixed, and a magnetization direction of the free layer 21 may be the same as or opposite to that of the fixed layer 23 depending on conditions. For example, in order to fix the magnetization direction of the fixed layer 23, an anti-ferromagnetic layer (not illustrated) may be further provided.

A resistance value of the MTJ element 20 may vary according to the magnetization direction of the free layer 21. In some example embodiments, when the magnetization direction of the free layer 21 is the same as the magnetization direction of the fixed layer 23, the MTJ element 20 may have a low resistance value and may store data '0'. Also, when the magnetization direction of the free layer 21 is opposite to that of the fixed layer 23, the MTJ element 20 may have a high resistance value and may store data '1'. In FIG. 2, the free layer 21 and the fixed layer 23 of the MTJ element 20 are illustrated as horizontal magnetic elements, but the present inventive concepts are not limited thereto, and a vertical magnetic element may be used as the free layer 21 and the fixed layer 23.

In order to perform a read operation of the STT-MRAM, a logic high voltage may be applied to the word line WL0 to turn the selection transistor CT on, and a read current may be applied from the source line SL0 to the bit line BL0 to determine data stored in the MTJ element 20. In some example embodiments, when an excessive read current flows to the bit line BL0, the magnetization direction of the free layer 21 may be altered, and accordingly, data stored in the MTJ element 20 may be altered. In the memory device, strength of the read current may be limited by controlling a bit line voltage.

In example embodiments of the present inventive concepts, a read operation is mainly illustrated and described.

Referring back to FIG. 1, the plurality of memory cells MC may include a normal memory cell and a reference memory cell. The reference memory cell may be used as a memory cell for sensing data of the normal memory cell. For example, when the normal memory cell indicates a first resistance state (e.g., data '1'), a variable resistance element of the normal memory cell may have a first resistance value. Also, when the normal memory cell indicates a second resistance state (e.g., data '0'), the variable resistance element of the normal memory cell may have a second resistance value. A resistance value of a variable resistance element of the reference memory cell may have an intermediate value between the first resistance value and the second resistance value. Two bit lines among the bit lines connected to one sense amplifier 50 may be used to provide reference memory cells, but the number of bit lines providing reference memory cells may be variously altered.

In a read operation for reading data stored in a selected memory cell TC, the row decoder 20 may input a read voltage (e.g., a source voltage) to the first word line WL0. The first word line WL0 may be a selected word line, and the switching elements connected to the first word line WL0 may be turned on. The bit lines BL0 and BL1 may be selected as the selected bit lines BL0 and BL1 according to an on/off operation of switches existing between the bit lines and the sense amplifier 50. The selected memory cell TC connected to the selected word line WL0 and the selected bit line BL1 may be referred to as a target memory cell, and a selected memory cell RC connected to the selected word line WL0 and the selected bit line BL0 may be referred to as a reference memory cell.

The read reference current generator 30 may determine a voltage level of the selected bit lines BL0 and BL1. The determined voltage level may determine a target read current that is a maximum read current that may flow through the selected bit lines BL0 and BL1. The target read current may refer to a maximum bit line current. A reference clamp voltage $V_{CLAMP\_REF}$ may be a voltage generated by the target read current determined by the read reference current generator 30. The buffer 40 may be an operational transconductance amplifier (OTA) buffering the target read current generated by the read reference current generator 30. The buffer 40 may stabilize the reference clamp voltage $V_{CLAMP\_REF}$ and output it as a clamp voltage $V_{CLAMP}$.

Clamping circuits NT0 and NT1 may clamp a voltage level of the selected bit line to a predetermined or alternatively, desired value in response to the clamp voltage $V_{CLAMP}$. The clamping circuits NT0 and NT1 may include NMOS transistors.

In response to the clamp voltage $V_{CLAMP}$, the NMOS transistors NT0 and NT1 may supply a first bit line voltage V0 to the first bit line BL0 and may supply a second bit line voltage V1 to the second bit line BL1. A level of the first bit line voltage V0 and a level of the second bit line voltage V1 may be equal to each other. A first read current $I_{READ0}$ may flow from the first source line SL0 to the first bit line BL0 by the first bit line voltage V0, and a second read current $I_{READ1}$ may flow from the second source line SL1 to the second bit line BL1 by the second bit line voltage V1. The bit line voltages V0 and V1 may be supplied only to the selected bit lines BL0 and BL1 according to an on/off operation of switches existing between the bit lines and the sense amplifier 50.

A level of the first read current $I_{READ0}$ flowing through the first bit line BL0 may vary depending on a resistance state of the reference memory cell RC, and a level of the second read current $I_{READ1}$ flowing through the second bit line BL1 may vary depending on a resistance state of the target memory cell TC.

The sense amplifier 50 may receive the first read current $I_{READ0}$ flowing through the first bit line BL0 and the second read current $I_{READ1}$ flowing through the second bit line BL1. The sense amplifier 50 may compare the first read current $I_{READ0}$ with the second read current $I_{READ1}$ and determine the data stored in the target memory cell TC as '0' or '1' based on a comparison result. For example, when the level of the second read current $I_{READ1}$ is greater than the level of the first read current $I_{READ0}$, the sense amplifier 50 may determine the data stored in the target memory cell TC as '1', and when the level of the second read current $I_{READ1}$ is lower than the level of the first read current $I_{READ0}$, the sense amplifier 50 may determine the data stored in the target memory cell TC as '0'. The sense amplifier 50 may output a determination result OUT.

When an excessive read current flows to the bit line, a resistance value of the variable resistance element may change. Accordingly, the read reference current generator 30 may limit a strength of the read current by clamping the level of the bit line voltage to a predetermined or alternatively, desired value.

According to example embodiments of the present inventive concepts, a size of a temperature coefficient (TC) controller for adjusting a temperature coefficient of a maximum bit line current may be reduced. Accordingly, a size of the read reference current generator 30 may be reduced. In addition, temperature coefficients and absolute values of read reference currents determining a target read current may be controlled by different elements. Thus, a stable supply of the target read current may be ensured. In addition, a range of the target read current may be variously adjusted.

Figure 3:
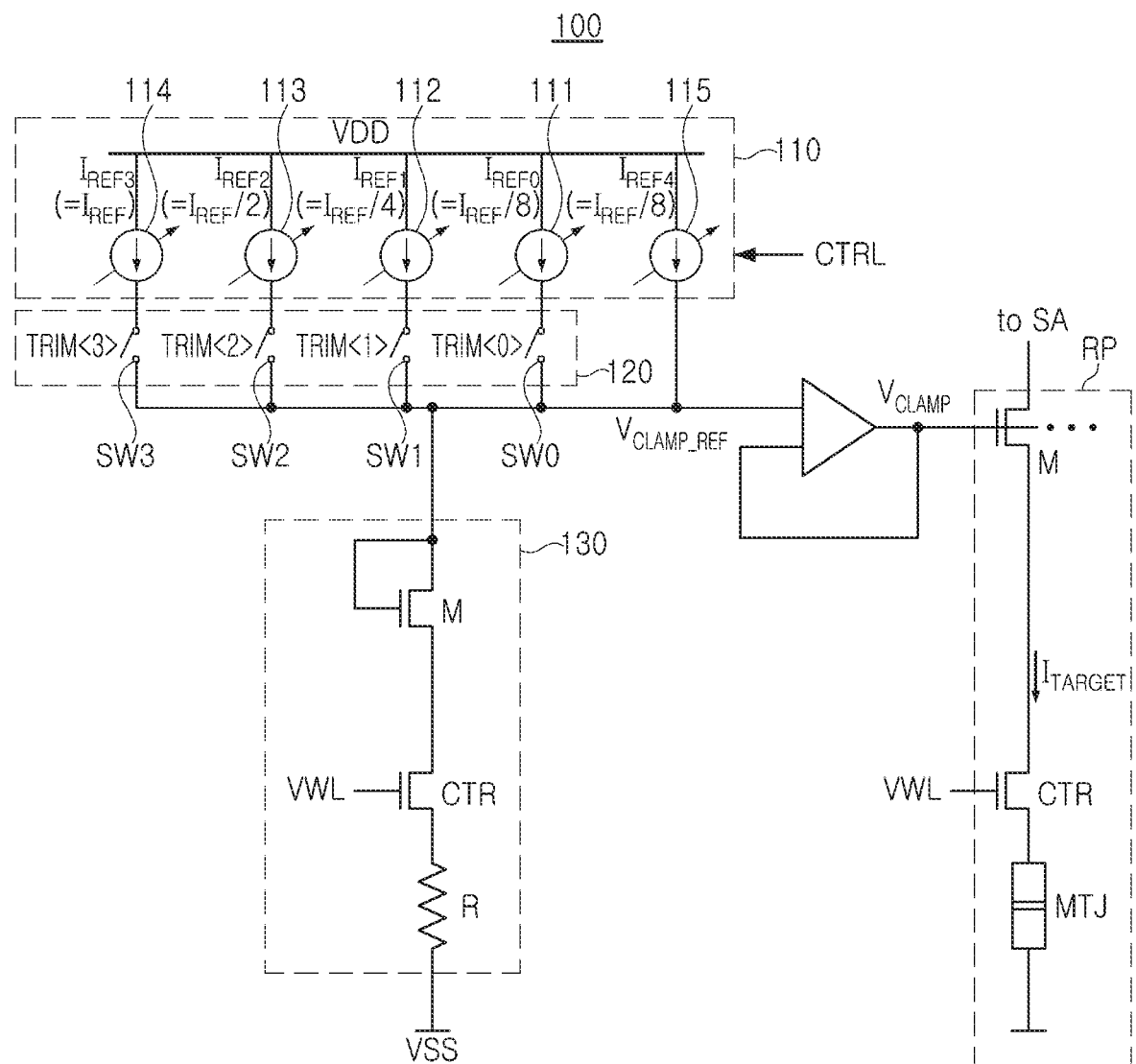
FIG. 3 is a view illustrating an operation of a read reference current generator according to example embodiments of the present inventive concepts.
Figure 4:
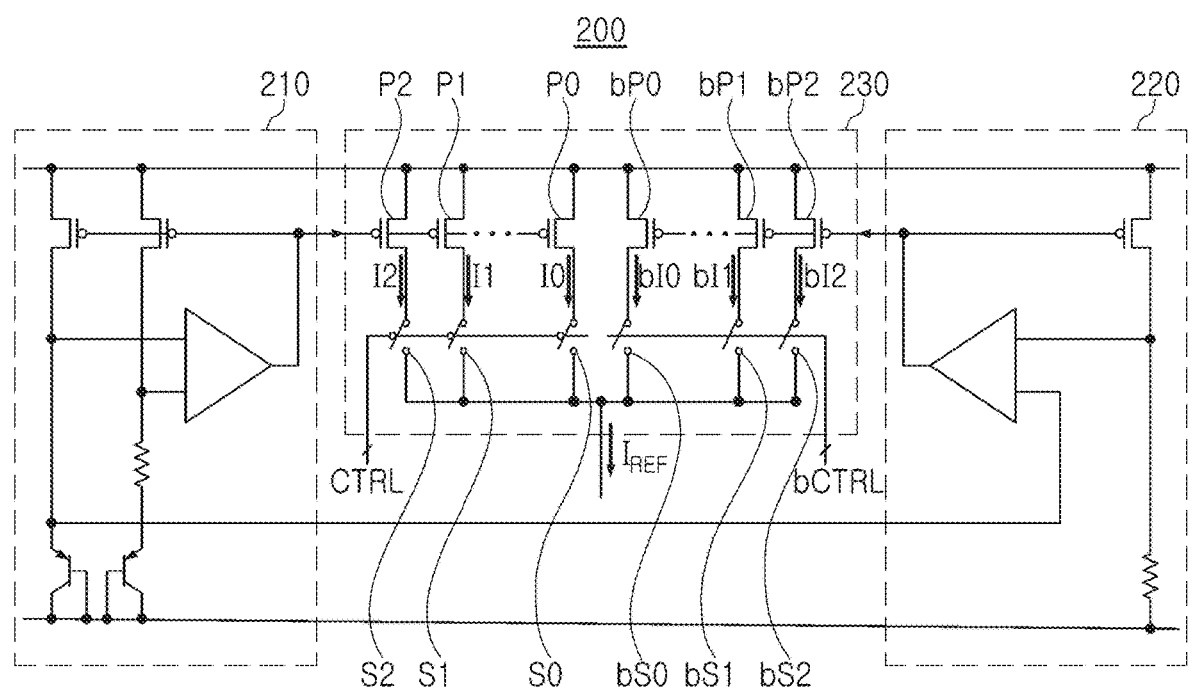
FIG. 4 is a circuit diagram illustrating a temperature coefficient (TC) controller of FIG. 3.

FIG. 3 is a view illustrating an operation of the read reference current generator according to example embodiments of the present inventive concepts, and FIG. 4 is a circuit diagram illustrating a TC controller of FIG. 3.

Referring to FIG. 3, a read reference current generator 100 may include a TC controller block 110, a switch block 120, and/or a replica circuit 130. The replica circuit 130 may be implemented with the same elements as elements of a data read path RP. The data read path RP may refer to an electrical path through which data stored in a target memory cell is transferred to a sense amplifier. The data read path RP may include a selected memory cell and a clamping circuit M clamping a voltage level of a selected bit line to a determined value. The selected memory cell may include a switching element CTR and a variable resistance element MTJ.

The TC controller block 110 may include a plurality of TC controllers 111 to 115. The plurality of TC controllers 111 to 115 may include a first TC controller 115 and second TC controllers 111 to 114 having different scale factors. A scale factor of the first TC controller 115 may be the same as any one of the scale factors of the second TC controllers 111 to 114, but is not limited thereto and the first TC controller 115 may have various scale factors.

The plurality of TC controllers 111 to 115 may generate read reference currents $I_{REF0}$-$I_{REF4}$, respectively. The first TC controller 115 may adjust a temperature coefficient in response to a first control signal CTRL and generate a first read reference current $I_{REF4}$ having an adjusted temperature coefficient. The second TC controllers 111 to 114 may adjust a temperature coefficient in response to the first control signal CTRL and respectively generate second read reference currents $I_{REF0}$ to $I_{REF3}$ each having an adjusted temperature coefficient. The temperature coefficient refers to a rate of change of a read reference current level with respect to temperature, and may also be referred to as a temperature gradient. As an example, the plurality of TC controllers 111 to 115 may be controlled to generate read reference currents having the same temperature coefficient.

Referring to FIG. 4, a proportional to absolute temperature (PTAT) current source 210 may generate a first output current having a characteristic proportional to temperature. The complementary to absolute temperature (CTAT) current source 220 may generate a second output current having a characteristic inversely proportional to temperature. A TC controller 200 may include a current mirror circuit 230 outputting a read reference current $I_{REF}$ in response to the first output current from the PTAT current source 210 and the second output current from the CTAT current source 220. Each of the plurality of TC controllers 111 to 115 of FIG. 3 may include the current mirror circuit 230 illustrated in FIG. 4 and may share the PTAT current source 210 and the CTAT current source 220 with each other.

The current mirror circuit 230 may include a first current mirror circuit and a second current mirror circuit. The first current mirror circuit may include first PMOS transistors P0, P1, and P2 and first switches S0, S1, and S2 respectively connected to the first PMOS transistors P0, P1, and P2. The second current mirror circuit may include second PMOS transistors bP0, bP1, and bP2 and second switches bS0, bS1, and bS2 respectively connected to the second PMOS transistors bP0, bP1, and bP2.

The first switches S0, S1, and S2 may operate in response to the first control signal CTRL, and the second switches bS0, bS1, and bS2 may operate in response to a second control signal bCTRL (or CTRL2). The second control signal CTRL2 may be a complementary signal of the first control signal CTRL1. Accordingly, the first switches S0, S1, and S2 and the second switches bS0, bS1, and bS2 may be complementarily controlled in response to the control signals CTRL and bCTRL.

The first PMOS transistors P0, P1, and P2 may be connected to the PTAT current source 210 and mirror the first output current from the PTAT current source 210 to generate a plurality of first replica currents I0 to I2. The first switches S0, S1, and S2 may output some selected from the plurality of first replica currents I0 to I2 in response to the first control signal CTRL1.

The second PMOS transistors bP0, bP1, and bP2 may be connected to the CTAT current source 220 and mirror the second output current from the CTAT current source 220 to generate a plurality of second replica currents bI0 to bI2. The second switches bS0, bS1, and bS2 may output some selected from the plurality of second replica currents bI0 to bI2 in response to the second control signal bCTRL.

Since the first switches S0, S1, and S2 and the second switches bS0, bS1, and bS2 are controlled complementarily to each other, any one of the first current I0 and the second current bI0 may be output, any one of the first current I1 and the second current bI1 may be output, and any one of the first current I2 and the second current bI2 may be output.

Sizes of the first PMOS transistors P0, P1, and P2 may be different from each other, and sizes of the second PMOS transistors bP0, bP1, and bP2 may be different from each other. Also, the sizes of the first PMOS transistors P0, P1, and P2 and the sizes of the second PMOS transistors bP0, bP1, and bP2, which are complimentarily controlled, may be the same as each other. For example, the size of the first PMOS transistor P0 and the size of the second PMOS transistor bP0 may be the same as each other, the size of the first PMOS transistor P1 and the size of the second PMOS transistor bP1 may be the same as each other, and the size of the first PMOS transistor P2 and the size of the second PMOS transistor bP2 may be the same as each other.

Figures 5, 6:
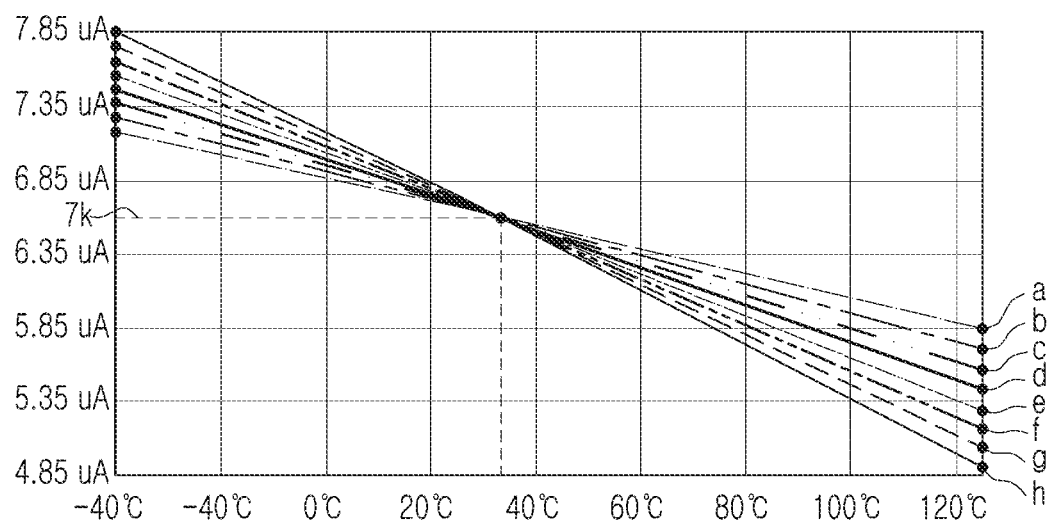
FIG. 5 illustrates a replica current generated by the TC controller of FIG. 4.
FIG. 6 illustrates read reference currents that the TC controller of FIG. 4 may generate.

FIG. 5 illustrates a replica current generated by the TC controller of FIG. 4, and FIG. 6 illustrates read reference currents that the TC controller of FIG. 4 may generate.

Referring to FIGS. 4 and 5 together, since the sizes of the first PMOS transistors P0, P1, and P2 are different from each other, temperature gradients and absolute values of the plurality of first replica currents I0 to I2 may be different from each other. For example, the first replica current I0 may have a first positive temperature gradient (e.g., a) and a first absolute value (e.g., k), the first replica current I1 may have a second positive temperature gradient (e.g., 2a) and a second absolute value (e.g., 2k), and the first replica current I2 may have a third positive temperature gradient (e.g., 4a) and a third absolute value (4k).

Since the sizes the second PMOS transistors bP0, bP1, and bP2 are different from each other, temperature gradients and absolute values of the plurality of second replica currents bI0 to bI2 may be different from each other. For example, the second replica current I0 may have a first negative temperature gradient (e.g., −a) and a first absolute value (e.g., k), the second replica current I1 may have a second negative temperature gradient (e.g., −2a) and a second absolute value (e.g., 2k), and the second replica current I2 may have a third negative temperature gradient (e.g., −4a) and a third absolute value (e.g., 4k).

Since the sizes of the first PMOS transistors P0, P1, and P2 and the sizes of the second PMOS transistors bP0, bP1, and bP2, which are complementarily controlled to each other, are the same as each other, a pair of first replica currents I0 to I2 and second replica currents bI0 to bI2 may have temperature gradients of different signs and the same absolute values.

For example, the first switch S1 may be turned on and the first switches S0 and S2 may be turned off in response to the first control signal CTRL, and the second switches bS0 and bS2 may be turned on and the second switch bS1 may be turned off in response to the second control signal bCTRL. Accordingly, the read reference current $I_{REF}$ that the TC controller 200 may generate may be the sum of the first replica current I1 and the second replica currents bI0 and bI2. In example embodiments illustrated in FIG. 5, the read reference current $I_{REF}$ may be expressed as follows.

$$I_{REF} = I1 + bI0 + bI2$$
$$= [2a \cdot (T - 25°C.) + 2k] + [-a \cdot (T - 25°C.) + k] + [-4a \cdot (T - 25°C.) + 4k]$$
$$= -3a \cdot (T - 25°C.) + 7k$$

In some example embodiments, T may indicate a current temperature inside the memory device, −3a may indicate a temperature gradient of the read reference current $I_{REF}$, and 7k may indicate an absolute value of the read reference current $I_{REF}$ at 25° C.

The TC controller 200 may adjust the temperature gradient of the read reference current $I_{REF}$ by combining the mirror currents generated by the plurality of PMOS transistors P0, P1, P2, bP0, bP1, and bP2.

Referring to FIGS. 4 and 6, the number of examples of the read reference currents $I_{REF}$ that the TC controller 200 may generate may be $2^n$. In some example embodiments, n may represent the number of PMOS transistor pairs (P0 and bP0, P1 and bP1, and P2 and bP2) included in the TC controller 200. In example embodiments illustrated in FIG. 4, since the number of PMOS transistor pairs (P0 and bP0, P1 and bP1, P2 and bP2) included in the TC controller 200 is 3, the number of examples of the read reference currents $I_{REF}$ that the TC controller 200 may output may be 8. The read reference currents $I_{REF}$ that one TC controller 200 may output may have the same absolute value (e.g., 7k) at a specific temperature (e.g., 25° C.) and may be different only in the temperature gradient.

Referring back to FIG. 3, the plurality of TC controllers 111 to 115 may be controlled to output read reference currents $I_{REF0}$ to $I_{REF4}$ having the same temperature coefficient as each other. The plurality of TC controllers 111 to 115 may have different scale factors from each other. Accordingly, the read reference currents $I_{REF0}$ to $I_{REF4}$ output from the plurality of TC controllers 111 to 115 may have the same temperature gradient and different absolute values. The scale factors may be determined according to the sizes of the PMOS transistors included in the plurality of TC controllers 111 to 115.

The replica circuit 130 may determine a voltage level of a selected bit line as a constant voltage level. The switch block 120 may include a plurality of switches SW0 to SW3 connected to the second TC controllers 111 to 114. The plurality of switches SW0 to SW3 may operate in response to second control signals TRIM<0> to TRIM<3>. A connection of the second TC controllers 111 to 114 and the replica circuit 130 may be controlled.

The first switch SW0 may output the second read reference current $I_{REF0}$ of the second TC controller 111 to the replica circuit 130 in response to the second control signal TRIM<0>, the second switch SW1 may output the second read reference current $I_{REF1}$ of the second TC controller 112 to the replica circuit 130 in response to the second control signal TRIM<1>, the third switch SW2 may output the second read reference current $I_{REF2}$ of the second TC controller 113 to the replica circuit 130 in response to the second control signal TRIM<2>, and the fourth switch SW3 may output the second read reference current $I_{REF3}$ of the second TC controller 114 to the replica circuit 130 in response to the second control signal TRIM<3>. The first TC controller 115 may output the first read reference current $I_{REF4}$ to the replica circuit 130.

For example, the scale factor of the second TC controller 111 may be ⅛, the scale factor of the second TC controller 112 may be ¼, the scale factor of the second TC controller 113 may be ½, the scale factor of the second TC controller 114 may be 1, and the scale factor of the first TC controller 115 may be ⅛. On the assumption that, when the scale factor is 1, the read reference current $I_{REF}$ is $-3a\cdot(T-25°\,C.)+7k$, the first read reference current $I_{REF4}$ and the second read reference currents $I_{REF0}$ to $I_{REF3}$ are as follows.

Second read reference current $(I_{REF0})=-3a\cdot(T-25°\,C.)+7k/8$

Second read reference current $(I_{REF1})=-3a\cdot(T-25°\,C.)+7k/4$

Second read reference current $(I_{REF2})=-3a\cdot(T-25°\,C.)+7k/2$

Second read reference current $(I_{REF3})=-3a\cdot(T-25°\,C.)+7k$

Second read reference current $(I_{REF4})=-3a\cdot(T-25°\,C.)+7k/8$

The read reference current generator 100 may generate a target read current $I_{TARGET}$ by combining the read currents $I_{REF0}$ to $I_{REF4}$ generated by the plurality of TC controllers 111 to 115. In other words, the sum of the first read reference current $I_{REF4}$ and the second read reference currents $I_{REF0}$ to $I_{REF3}$ selected in response to the second control signal TRIM<0> to TRIM<3> may determine the target read current, which is a maximum bit line current of a selected bit line.

Figure 7:
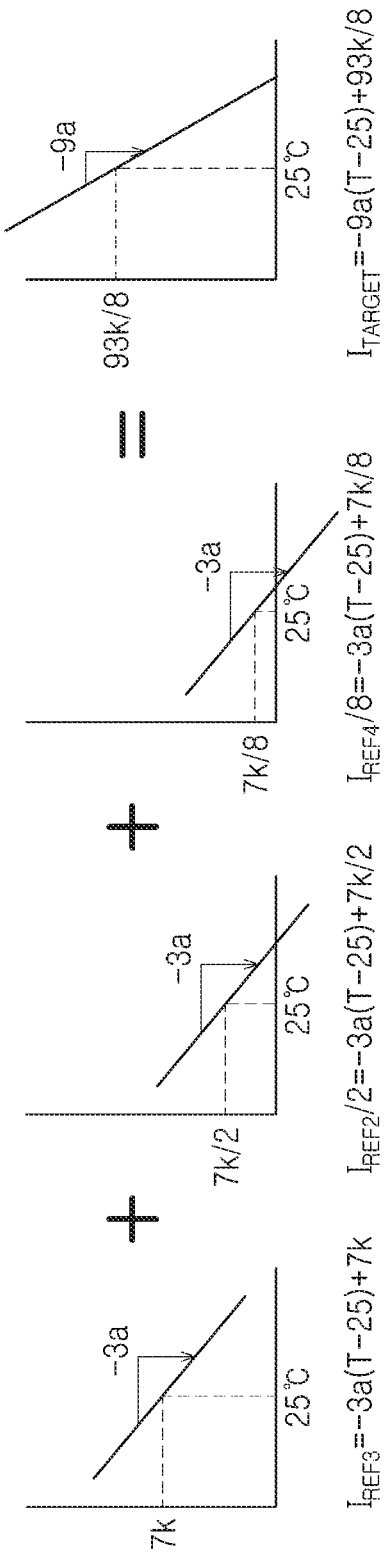
FIG. 7 is a view illustrating a method of generating a target read current according to example embodiments of the present inventive concepts.
Figure 8:
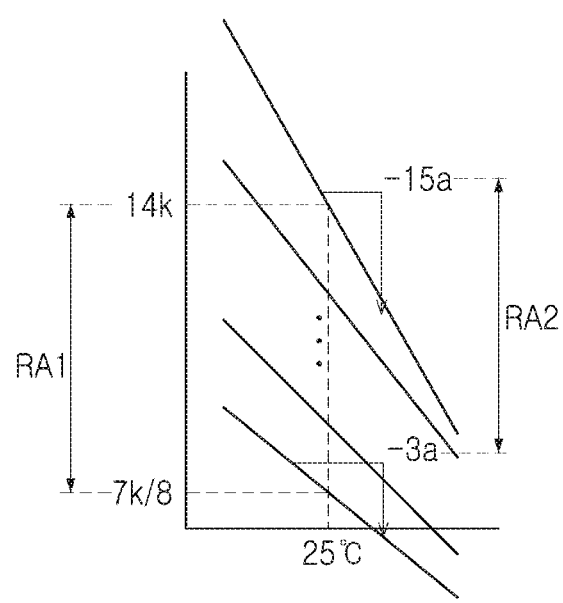
FIG. 8 illustrates target read currents that may be generated by a read reference current generator according to example embodiments of the present inventive concepts.

FIG. 7 is a view illustrating a method of generating a target read current according to example embodiments of the present inventive concepts, and FIG. 8 illustrates target read currents that may be generated by a read reference current generator according to example embodiments of the present inventive concepts.

Referring to FIGS. 3 and 7 together, it is assumed that the third switch SW2 and the fourth switch SW3 are turned on, respectively, and the first switch SW0 and the second switch SW1 are turned off, respectively. The target read current $I_{TARGET}$ may be the sum of the third read reference current $I_{REF2}$, the fourth read reference current $I_{REF3}$, and the fifth read reference current $I_{REF4}$.

Referring to FIGS. 3 and 8 together, the number of examples of the target read currents $I_{TARGET}$ that the read reference current generator 100 may generate may be $2^n$. In some example embodiments, n may represent the number of the second TC controllers 111 to 114. In example embodiments illustrated in FIG. 3, since the number of the second TC controllers 111 to 114 is 4, the number of examples of the target read current $I_{TARGET}$ that the read reference current generator 100 may generate may be 16.

The temperature gradients and the absolute values of the target read currents $I_{TARGET}$ that the read reference current generator 100 may generate may be different from each other. For example, the absolute values of the target read currents $I_{TARGET}$ may be adjusted within a first range (e.g., 7k/8-14k; RA1), and the temperature gradients of the target read currents $I_{TARGET}$ may be adjusted within a second range (e.g., $-3a$ to $-15a$).

A temperature coefficient and an absolute value of the target read current $I_{TARGET}$ may be adjusted in response to the first control signal CTRL and the second control signals TRIM<0> to TRIM<3>, respectively.

Figure 9:
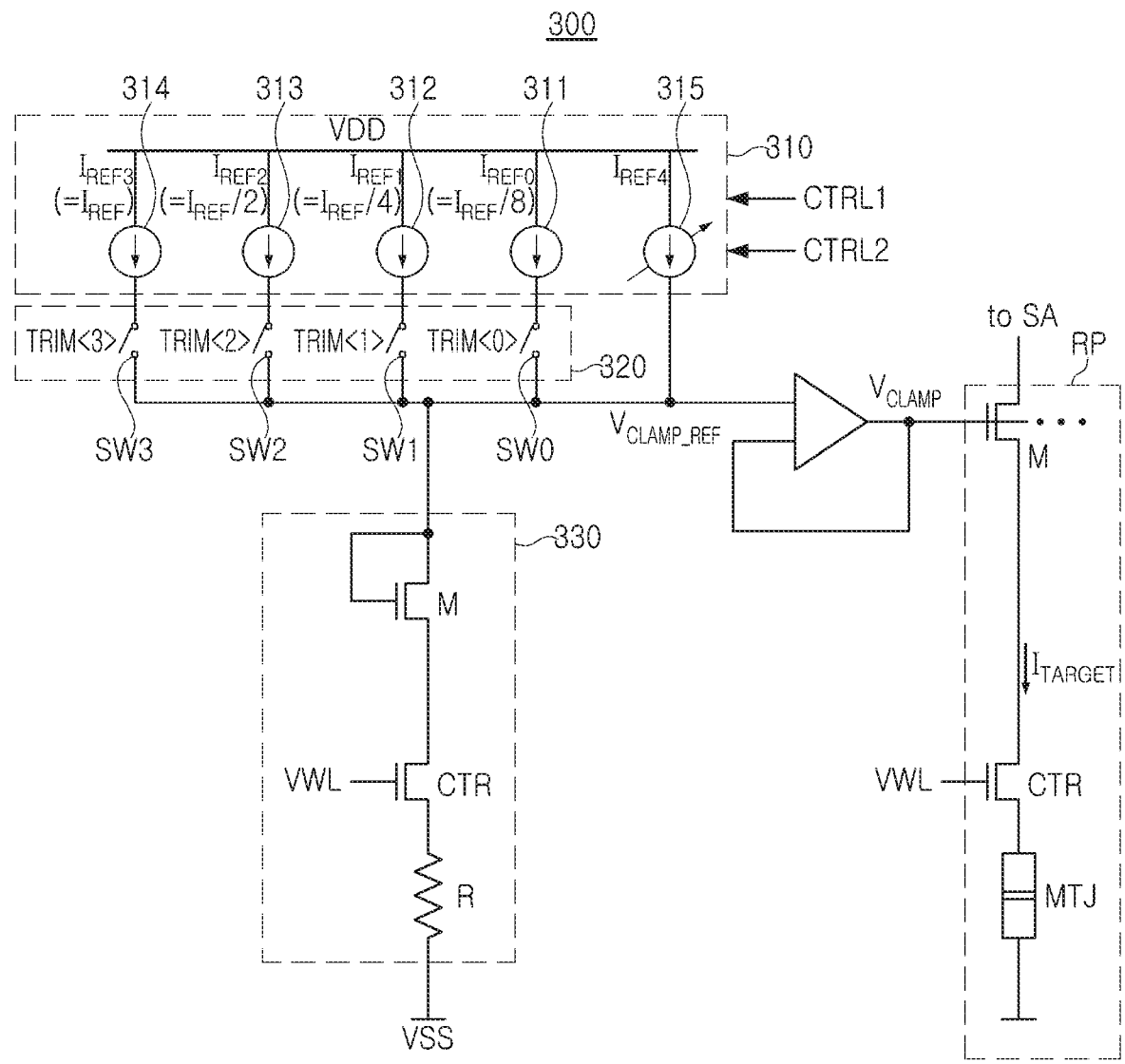
FIG. 9 is a view illustrating an operation of a read reference current generator according to example embodiments of the present inventive concepts.
Figure 10:
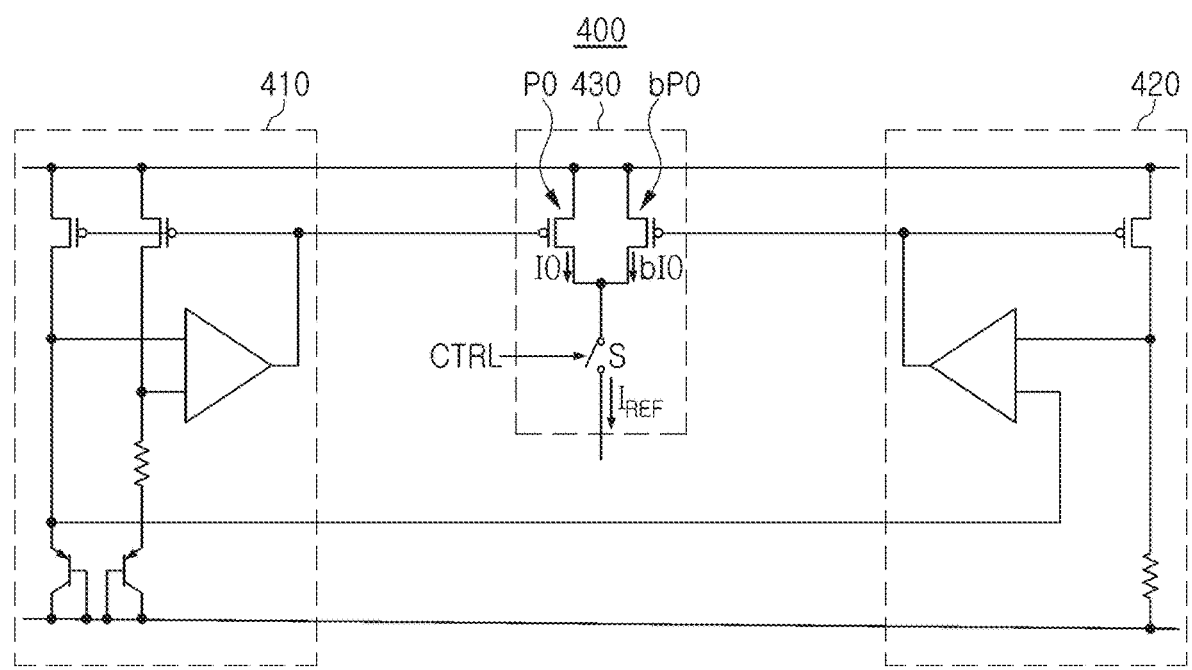
FIG. 10 is a circuit diagram illustrating a TC controller of FIG. 9.

FIG. 9 is a view illustrating an operation of a read reference current generator according to example embodiments of the present inventive concepts, and FIG. 10 is a circuit diagram illustrating a TC controller of FIG. 9.

Referring to FIG. 9, a read reference current generator 300 may include a TC controller block 310, a switch block 320, and/or a replica circuit 330. Unlike the second TC controllers 111 to 114 of FIG. 3, the second read reference current $I_{REF0}$ to $I_{REF3}$ respectively generated by the second TC controllers 311 to 314 of FIG. 9 may have a zero temperature coefficient that does not change with temperature. A structure of the second TC controllers 311 to 314 of FIG. 9 may be different from that of the second TC controllers 111 to 114 of FIG. 3. Hereinafter, the structure of the second TC controllers 311 to 314 of FIG. 9 will be described with reference to FIG. 10.

Referring to FIG. 10, a TC controller 400 may include a current mirror circuit 430 outputting a read reference current $I_{REF}$ in response to a first output current from a PTAT current source 410 and a second output current from a CTAT current source 420.

The current mirror circuit 430 may include a first PMOS transistor P0, a second PMOS transistor bP0, and a switch S. The first PMOS transistor P0 may be connected to the PTAT current source 410 and may generate a first replica current I0 by mirroring the first output current of the PTAT current source 410. The second PMOS transistor bP0 may be connected to the CTAT current source 420, and may generate a second replica current bI0 by mirroring the second output current of the CTAT current source 420. The size of the first PMOS transistor P0 and the size of the second PMOS transistor bP0 may be the same as each other.

When the switch S is turned on in response to the control signal CTRL, the read reference current $I_{REF}$ that the TC controller 400 may generate may be the sum of the first replica current I0 and the second replica current bI0.

As an example, the TC controller 200 of FIG. 3 may include six PMOS transistors, and the TC controller 400 of FIG. 10 may include two PMOS transistors. Accordingly, the size of the TC controller 400 of FIG. 10 may be smaller than the size of the TC controller 200 of FIG. 3.

Referring back to FIG. 9, the first TC controller 315 may adjust a temperature coefficient in response to the first control signal CTRL1 and generate a first read reference current $I_{REF4}$ having the adjusted temperature coefficient. The plurality of second TC controllers 311 to 314 may generate second read reference currents $I_{REF0}$ to $I_{REF3}$ having different absolute values in response to the second control signal CTRL2. Since each of the second read reference currents $I_{REF0}$ to $I_{REF3}$ has a zero temperature coefficient that does not change with temperature, each of the plurality of second TC controllers 311 to 314 may be referred to as a current source.

Each of the plurality of second TC controllers 311 to 314 may have a different scale factor for each of the plurality of second TC controllers 311 to 314. Accordingly, the second read reference currents $I_{REF0}$ to $I_{REF3}$ output by the plurality of second TC controllers 311 to 314 may have different absolute values. The scale factor may be determined according to the size of each of the PMOS transistors included in the plurality of second TC controllers 311 to 314.

The replica circuit 330 may determine a voltage level of the selected bit line as a constant voltage level. The plurality of switches SW0 to SW3 may control connection of the plurality of second TC controllers 311 to 314 and the replica circuit 330 in response to the third control signals TRIM<0> to TRIM<3>.

The sum of the first read reference current $I_{REF4}$ and the second read reference currents $I_{REF0}$ to $I_{REF3}$ selected in response to the third control signals TRIM<0> to TRIM<3> may determine a target read current $I_{TARGET}$ that is the maximum bit line current of the selected bit line.

Figure 11:
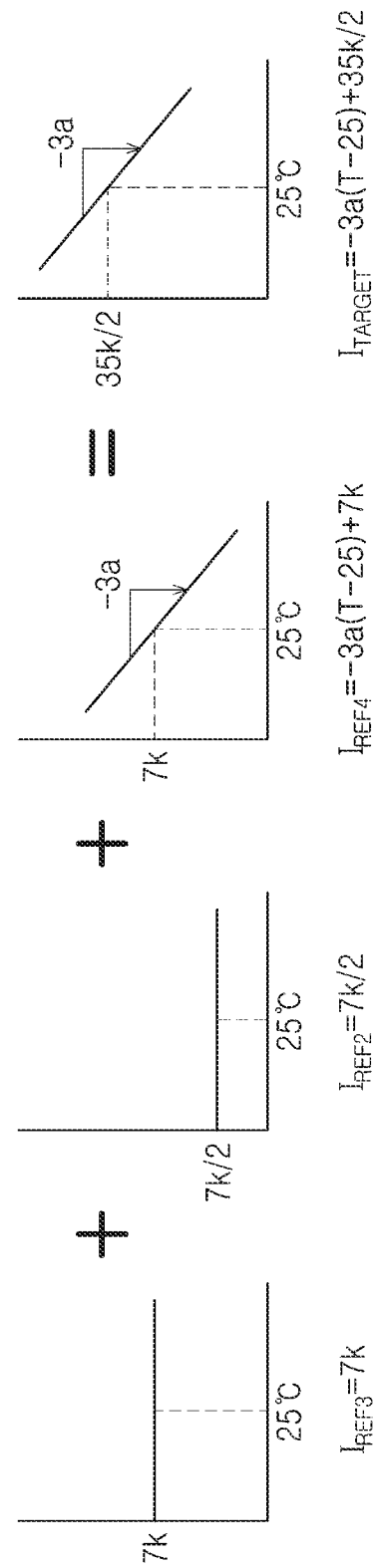
FIG. 11 is a view illustrating a method of generating a target read current according to example embodiments of the present inventive concepts.
Figure 12:
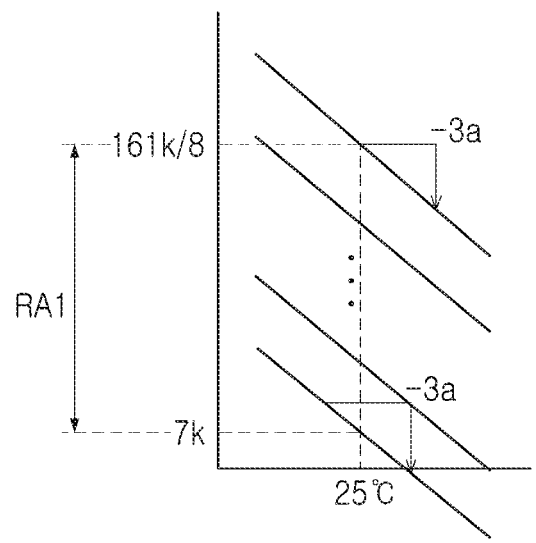
FIG. 12 illustrates target read currents that may be generated by a read reference current generator according to example embodiments of the present inventive concepts.

FIG. 11 is a view illustrating a method of generating a target read current according to example embodiments of the present inventive concepts, and FIG. 12 illustrates target read currents that may be generated by a read reference current generator according to example embodiments of the present inventive concepts.

Referring to FIGS. 9 and 11 together, it is assumed that the third switch SW2 and the fourth switch SW3 are turned on, respectively, and the first switch SW0 and the second switch SW1 are turned off, respectively. The target read current $I_{TARGET}$ may be the sum of the second read reference current $I_{REF2}$, the second read reference current $I_{REF3}$, and the first read reference current $I_{REF4}$. As illustrated in FIG. 11, the temperature gradient of the target read current $I_{TARGET}$ that the read reference current generator 300 may generate may be the same as the temperature gradient of the fifth read reference current $I_{REF4}$ generated by the first TC controller 315.

Referring to FIGS. 9 and 12 together, the number of examples of the target read currents $I_{TARGET}$ that the read reference current generator 300 may generate may be $2^n$. In some example embodiments, n may represent the number of the second TC controllers 311 to 314. In example embodiments illustrated in FIG. 9, since the number of the second TC controllers 311 to 314 is 4, the number of examples of the target read currents $I_{TARGET}$ that the read reference current generator 300 may generate may be 16.

The absolute values of the target read currents $I_{TARGET}$ that the read reference current generator 300 may generate may be different from each other. For example, the absolute values of the target read currents $I_{TARGET}$ may be adjusted within a first range (e.g., 7k-161k/8; RA1).

A temperature coefficient of the target read current $I_{TARGET}$ may be adjusted in response to the first control signal CTRL1, and the absolute value of the target read current $I_{TARGET}$ may be adjusted in response to the second control signal CTRL2 and the third control signals TRIM<0> to TRIM<3.

Since the temperature coefficient and absolute value of the read reference currents that determine the target read current may be controlled by different elements, a stable supply of the target read current may be ensured.

Figure 13:
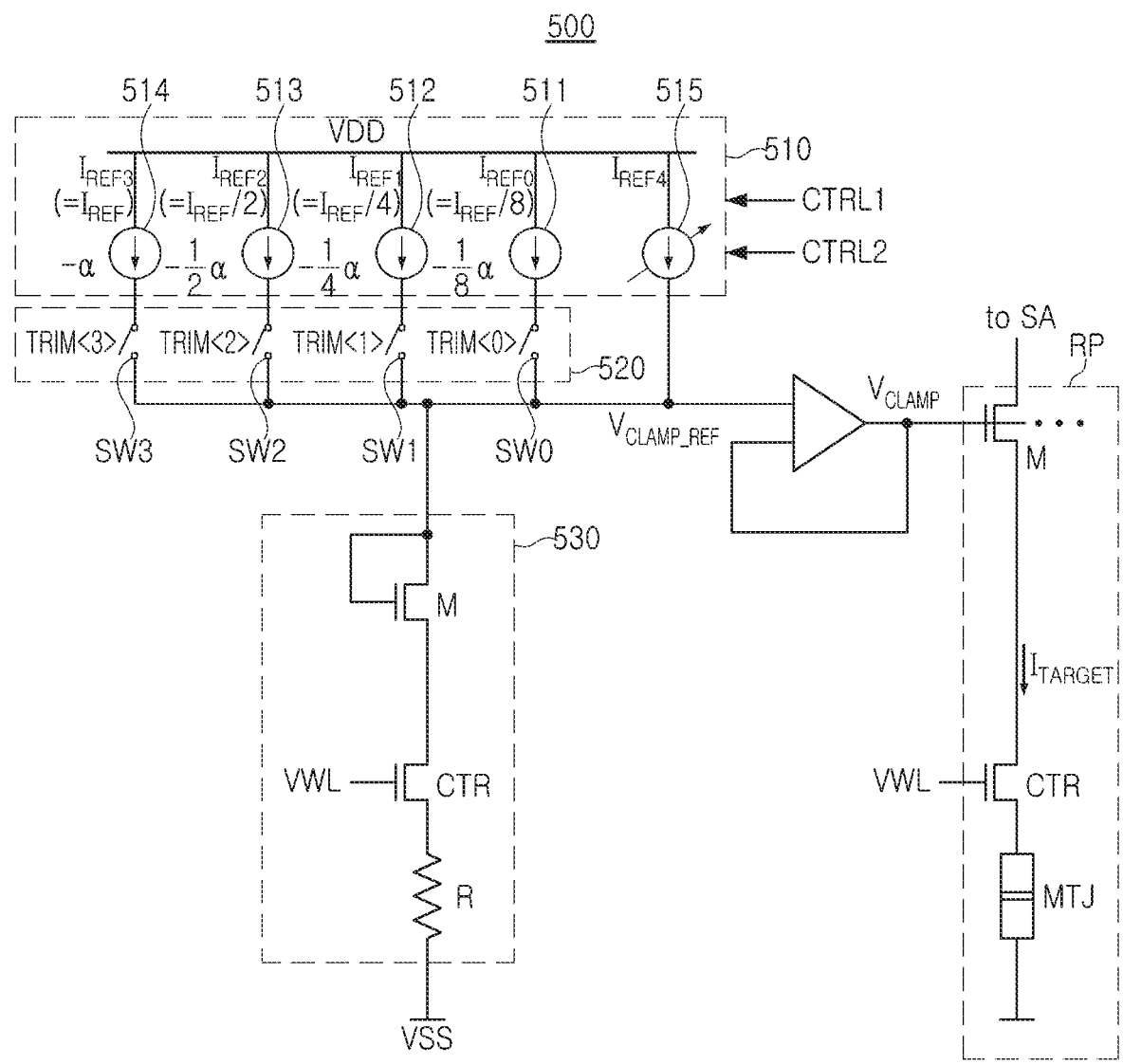
FIG. 13 is a view illustrating an operation of a read reference current generator according to example embodiments of the present inventive concepts.
Figure 14:
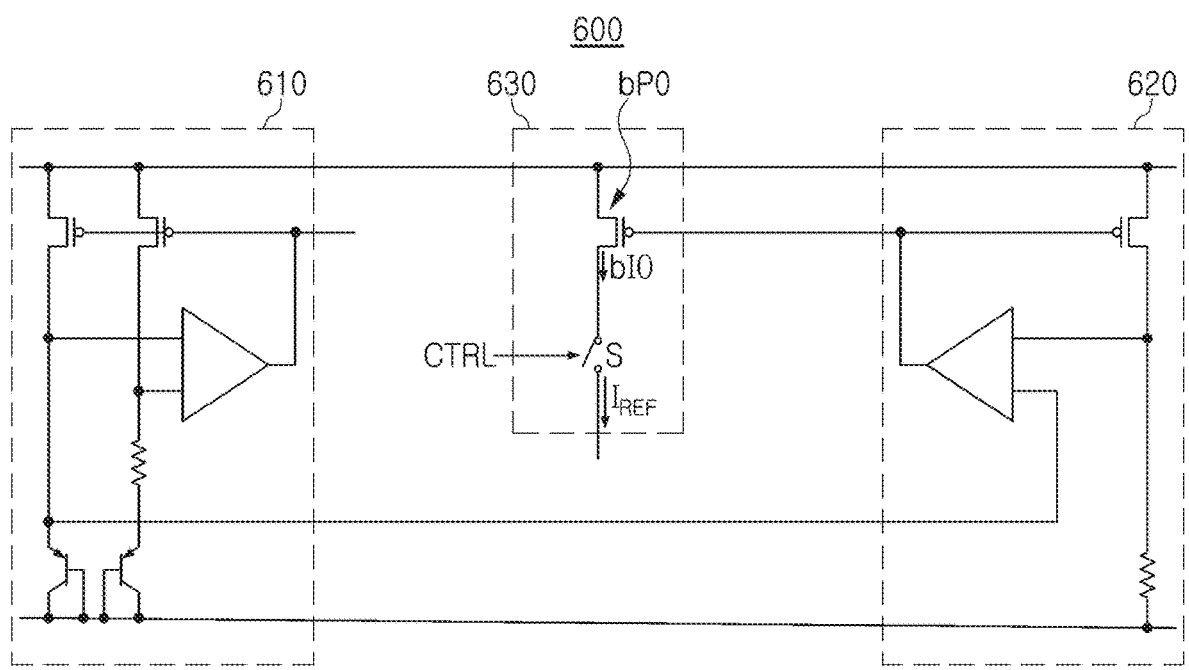
FIG. 14 is a circuit diagram illustrating a TC controller of FIG. 13.

FIG. 13 is a view illustrating an operation of a read reference current generator according to example embodiments of the present inventive concepts, and FIG. 14 is a circuit diagram illustrating a TC controller of FIG. 13.

Referring to FIG. 13, a read reference current generator 500 may include a TC controller block 510, a switch block 520, and/or a replica circuit 530. The TC controller block 510 may include a first TC controller 515 and second TC controllers 511 to 514. Unlike the second TC controllers 111 to 114 of FIG. 3, the read reference currents $I_{REF0}$ to $I_{REF3}$ respectively generated by the second TC controllers 511 to 514 of FIG. 13 may have a negative temperature coefficient. A structure of the second TC controllers 511 to 514 of FIG. 13 may be different from that of the second TC controllers 111 to 114 of FIG. 3. Hereinafter, the structure of the second TC controllers 511 to 514 of FIG. 13 will be described with reference to FIG. 14.

The first TC controller 515 may be directly connected to an input terminal of a buffer outputting the clamp voltage $V_{CLAMP}$. Referring to FIG. 13, a node between the first TC controller 515 and the replica circuit 530 may be directly connected to the input terminal of the buffer. The second TC controllers 511 to 514 may be connected to the input terminal of the buffer by a plurality of switches SW0 to SW4 included in the switch block 520, respectively.

Referring to FIG. 14, the TC controller 600 may include a current mirror circuit 630 outputting a read reference current $I_{REF}$ in response to the second output current of a CTAT current source 620.

The current mirror circuit 630 may include a PMOS transistor bP0 and a switch S. The PMOS transistor bP0 may be connected to the CTAT current source 620, and may generate a replica current bI0 by mirroring the second output current of the CTAT current source 620. When the switch S is turned on in response to the control signal CTRL, the TC controller 600 may output the replica current bI0 as the read reference current $I_{REF}$.

As an example, the TC controller 200 of FIG. 3 may include six PMOS transistors, and the TC controller 600 of FIG. 14 may include one PMOS transistor. Accordingly, a size of the TC controller 600 of FIG. 14 may be smaller than a size of the TC controller 200 of FIG. 3.

Referring back to FIG. 13, the first TC controller may adjust a temperature coefficient in response to the first control signal CTRL1 and generate a first read reference current $I_{REF4}$ having the adjusted temperature coefficient.

The plurality of second TC controllers 511 to 514 may generate second read reference currents $I_{REF0}$ to $I_{REF3}$ having different absolute values and different temperature coefficients in response to the second control signal CTRL. The plurality of second TC controllers 511 to 514 may have scale factors different from each other. Accordingly, the read reference currents $I_{REF0}$ to $I_{REF3}$ output from the plurality of second TC controllers 511 to 514 may have different temperature gradients and different absolute values. The scale factors may be determined according to sizes of PMOS transistors included in the plurality of second TC controllers 511 to 514.

The plurality of switches SW0 to SW3 may control connection of a plurality of second TC controllers 511 to 514 and a replica circuit 530 in response to the third control signals TRIM<0> to TRIM<3>.

The replica circuit 530 may determine a voltage level of a selected bit line to a constant voltage level. For example, the sum of the first read reference current $I_{REF4}$ and the second read reference currents $I_{REF0}$ to $I_{REF3}$ selected in response to the third control signals TRIM<0> to TRIM<3> may determine a target read current $I_{TARGET}$, which is a maximum bit line current of the selected bit line.

Figure 15:
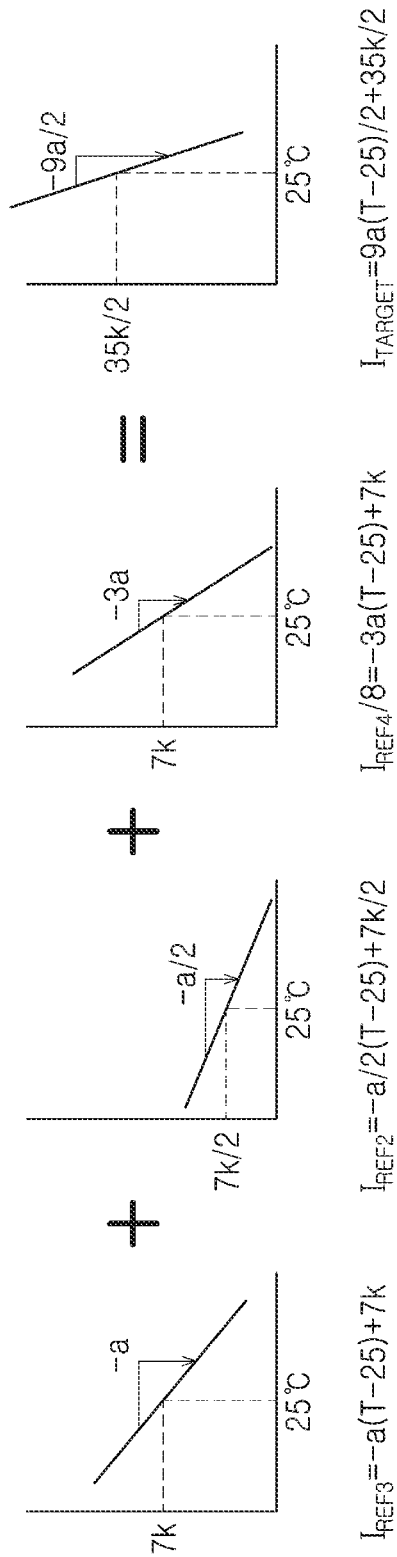
FIG. 15 is a view illustrating a method of generating a target read current according to example embodiments of the present inventive concepts.
Figure 16:
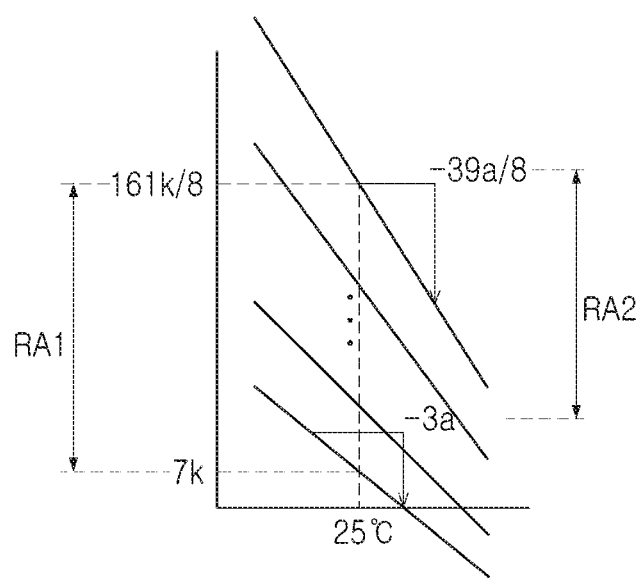
FIG. 16 illustrates target read currents that may be generated by a read reference current generator according to example embodiments of the present inventive concepts.

FIG. 15 is a view illustrating a method of generating a target read current according to example embodiments of the present inventive concepts, and FIG. 16 illustrates target read currents that may be generated by a read reference current generator according to example embodiments of the present inventive concepts.

Referring to FIGS. 13 and 15 together, it is assumed that the third switch SW2 and the fourth switch SW3 are turned on, respectively, and the first switch SW0 and the second switch SW1 are turned off, respectively. The target read current $I_{TARGET}$ may be the sum of the third read reference current $I_{REF2}$, the fourth read reference current $I_{REF3}$, and the fifth read reference current IREF4.

Referring to FIGS. 13 and 16 together, the number of examples of the target read current $I_{TARGET}$ that the read reference current generator 500 may generate may be $2^n$. In some example embodiments, n may represent the number of second TC controllers 511 to 514. In example embodiments illustrated in FIG. 13, since the number of the second TC controllers 511 to 514 is 4, the number of examples of the target read current $I_{TARGET}$ that the read reference current generator 500 may generate may be 16.

The temperature gradients and absolute values of the target read currents $I_{TARGET}$ that the read reference current generator 500 may generate may be different from each other. For example, the absolute values of the target read currents $I_{TARGET}$ may be adjusted within a first range (e.g., 7k-161k/8; RA1), and the temperature gradients of the target read currents $I_{TARGET}$ may be adjusted within a second range (e.g., −25a/8 to −39a/8).

The temperature coefficient and absolute value of the target read current $I_{TARGET}$ may be adjusted in response to the first control signal CTRL1, the second control signal CTRL2, and the third control signal TRIM<0> to TRIM<3>.

Figure 17:
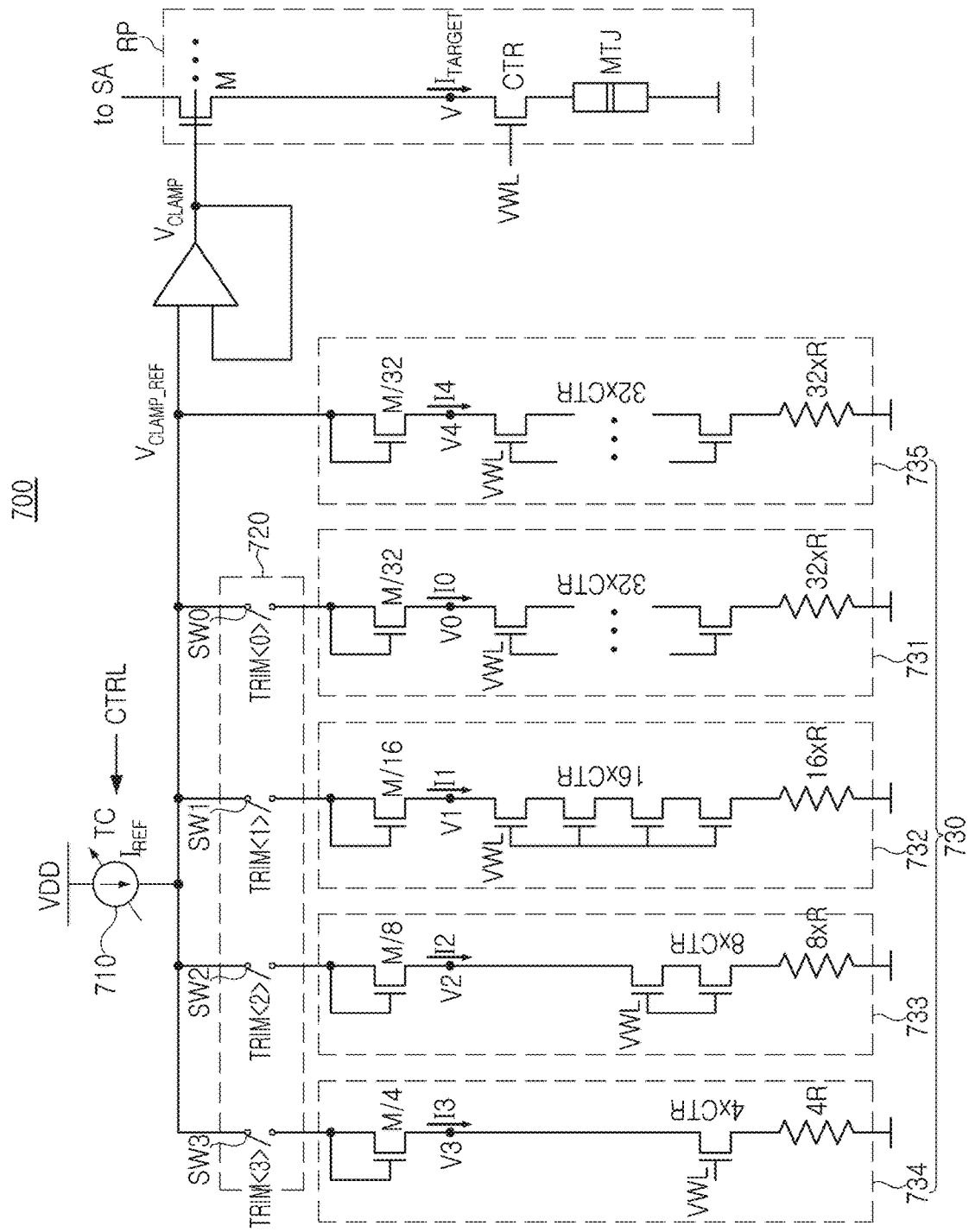
FIG. 17 is a view illustrating an operation of a read reference current generator according to example embodiments of the present inventive concepts.
Figure 18:
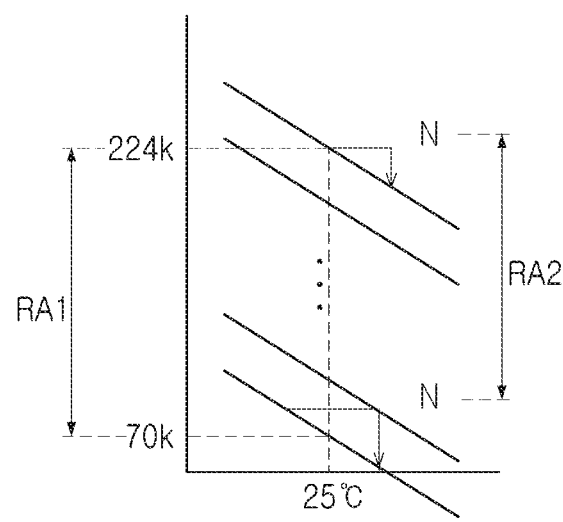
FIG. 18 illustrates target read currents that may be generated by a read reference current generator according to example embodiments of the present inventive concepts.

FIG. 17 is a view illustrating an operation of a read reference current generator according to example embodiments of the present inventive concepts, and FIG. 18 illustrates target read currents that may be generated by a read reference current generator according to example embodiments of the present inventive concepts.

Referring to FIG. 17, a read reference current generator 700 may include a TC controller 710, a switch block 720, and/or a plurality of replica circuits 731 to 735; 730. An equivalent resistance value of each of the plurality of replica circuits 731 to 735; 730 may be a multiple of an equivalent resistance value of the data read path RP.

For example, each of the plurality of replica circuits may include at least one NMOS transistor, however, may not include PMOS transistor. Also, at least one replica circuit, for example a fifth replica circuit 735, may be directly connected to the TC controller 710, and remaining replica circuits, for example first to fourth replica circuits 731 to 734 may be connected to the TC controller by the plurality of switches SW0 to SW3 included in the switch block 720. The number of NMOS transistors included in the fifth replica circuit 735 may be equal to the number of NMOS transistors included in the fourth replica circuit 734.

The TC controller 710 may adjust a temperature coefficient in response to the first control signal CTRL and generate a read reference current $I_{REF}$ having the adjusted temperature coefficient. Since a structure and operation of the TC controller 710 are the same as those of the TC controller of FIG. 3, a repeated description thereof is omitted.

Each of the plurality of replica circuits 731 to 735; 730 may receive a read reference current $I_{REF}$ from the TC controller 710. The plurality of replica circuits 731 to 735; 730 may generate a plurality of branch currents I0 to I4 by adjusting the absolute value of the read reference current IREF with different scale factors. The scale factors of the plurality of replica circuits 731 to 735; 730 may be inversely proportional to the equivalent resistance values of the plurality of replica circuits 731 to 735; 730.

The switch block 720 may include a plurality of switches SW0 to SW3 connected to the plurality of replica circuits 731 to 735; 730. The plurality of switches SW0 to SW3 may control connection of the TC controller 710 and the plurality of replica circuits 731 to 735; 730 in response to the second control signals TRIM<0> to TRIM<3>.

The first switch SW0 may output the read reference current $I_{REF}$ of the TC controller 710 to the first replica circuit 731 in response to the second control signal TRIM<0>, the second switch SW1 may output the read reference current $I_{REF}$ of the TC controller 710 to the second replica circuit 732 in response to the second control signal TRIM<1>, the third switch SW2 may output the read reference current $I_{REF}$ of the TC controller 710 to the third replica circuit 733 in response to the second control signal TRIM<2>, and the fourth switch SW3 may output the read reference current $I_{REF}$ of the TC controller 710 to the fourth replica circuit 734 in response to the second control signal TRIM<3>. The read reference current $I_{REF}$ of the TC controller 710 may be output to the fifth replica circuit 735.

For example, when equivalent resistance of the data read path RP is a first value R, a value of the equivalent resistance of the first replica circuit 731 may be 32 times the first value R, a value of the equivalent resistance of the second replica circuit 732 may be 16 times the first value R, a value of the equivalent resistance of the third replica circuit 733 may be 8 times the first value R, a value of the equivalent resistance of the fourth replica circuit 734 may be four times the first value R. A value of the equivalent resistance of the fifth replica circuit 735 may be 32 times the first value R. Assuming that the read reference current $I_{REF}$ is $-3a\cdot(T-25°\ C.)+7k$, the branch currents I0 to I4 flowing through each of the plurality of replica circuits 731 to 735; 730 are as follows.

The first current (I0)=$\{-3a\cdot(T-25°\ C.)+7k\}/16$
The second current (I1)=$\{-3a\cdot(T-25°\ C.)+7k\}/8$
The third current (I2)=$\{-3a\cdot(T-25°\ C.)+7k\}/4$
The fourth current (I3)=$\{-3a\cdot(T-25°\ C.)+7\}/2$
The fifth current (I4)=$\{-3a\cdot(T-25°\ C.)+7k\}/16$ It is assumed that the third switch SW2 and the fourth switch SW3 are turned on, respectively, and the first switch SW0 and the second switch SW1 are turned off, respectively. The target read current $I_{TARGET}$ may be the sum of 8 times the third branch current I2, 4 times the fourth branch current I3, and 32 times the fifth branch current I4.

The sum of branch currents I0 to I4 selected in response to the second control signals TRIM<0> to TRIM<3> may determine a voltage level of the selected bit line. In other words, the sum of the branch currents I0 to I4 selected in response to the second control signals TRIM<0> to TRIM<3> may determine the target read current $I_{TARGET}$, which is a maximum bit line current of the selected bit line.

Referring to FIGS. 17 and 18 together, the number of examples of target read currents $I_{TARGET}$ that the read reference current generator 700 may generate may be $2^n$. In some example embodiments, n may represent the number of replica circuits 731 to 734 connected to the switches SW0 to SW3. In example embodiments illustrated in FIG. 17, since the number of replica circuits 731 to 734 connected to the switches SW0 to SW3 is 4, the number of examples of the target read current $I_{TARGET}$ that the read reference current generator 100 may generate may be 16.

The absolute values of the target read currents $I_{TARGET}$ that the read reference current generator 700 may generate may be different from each other. For example, the absolute values of the target read currents $I_{TARGET}$ may be adjusted within a first range (e.g., 70k-224k; RA1).

The temperature coefficients of the target read currents $I_{TARGET}$ may be adjusted in response to the first control signal CTRL, and absolute values of the target read currents $I_{TARGET}$ may be adjusted in response to the second control signals TRIM<0> to TRIM<3>.

The temperature coefficients and absolute values of the read reference currents that determine the target read currents may be controlled by different elements. Therefore, a stable supply of the target read current may be ensured.

The range of target read currents $I_{TARGET}$ that may be generated by the read reference current generator 700 of FIG. 17 may be larger than the range of the target read currents $I_{TARGET}$ that the read reference current generator 100 of FIG. 3 may generate. Accordingly, the range of the target read currents may be variously adjusted.

As set forth above, according to example embodiments of the present inventive concepts, the size of the read reference current generator may be reduced and the chip size may be reduced.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While example embodiments have been shown and described above, it will be apparent to those skilled in the art that modifications and variations could be made without departing from the scope of the present inventive concepts as defined by the appended claims.

What is claimed is:

1. A read reference current generator comprising:
    a temperature coefficient (TC) controller configured to adjust a temperature coefficient in response to a first control signal and generate a read reference current having an adjusted temperature coefficient;
    a plurality of replica circuits configured to receive the read reference current and adjust an absolute value of the read reference current with different scale factors to generate a plurality of branch currents; and
    a plurality of switches configured to control connection of the TC controller and the plurality of replica circuits in response to a second control signal,
    wherein an equivalent resistance value of each of the plurality of replica circuits corresponds to a multiple of an equivalent resistance value of a data read path, and the data read path includes a selected memory cell and a clamping circuit clamping a voltage level of a selected bit line to a determined value.

2. The read reference current generator of claim 1, wherein a sum of branch currents selected in response to the second control signal determines the voltage level of the selected bit line.

3. The read reference current generator of claim 1, wherein a sum of branch currents selected in response to the second control signal determines a maximum bit line current of the selected bit line.

4. The read reference current generator of claim 3, wherein a temperature coefficient of the maximum bit line current is adjusted in response to the first control signal and an absolute value of the maximum bit line current is adjusted in response to the second control signal.

5. The read reference current generator of claim 1, wherein the scale factors of the plurality of replica circuits are inversely proportional to equivalent resistance values of the plurality of replica circuits.

6. The read reference current generator of claim 1, wherein each of the plurality of replica circuits includes at least one NMOS transistor and does not include a PMOS transistor.

7. The read reference current generator of claim 1, wherein at least one replica circuit among the plurality of replica circuits is directly connected to the TC controller, remaining replica circuits among the plurality of replica circuits are connected to the TC controller by the plurality of switches.

8. The read reference current generator of claim 7, wherein a number of NMOS transistors included in one of the remaining replica circuits is equal to a number of NMOS transistors included in the at least one replica circuit.

9. A read reference current generator comprising:
    a first temperature coefficient (TC) controller configured to adjust a temperature coefficient in response to a first control signal and generate a first read reference current having an adjusted temperature coefficient;
    a plurality of second TC controllers configured to generate second read reference currents having different absolute values and different temperature coefficients in response to a second control signal;
    a replica circuit configured to determine a voltage level of a selected bit line to a constant voltage level; and
    a plurality of switches configured to control connection of the plurality of second TC controllers and the replica circuit in response to a third control signal.

10. The read reference current generator of claim 9, wherein the second read reference currents have a negative temperature coefficient.

11. The read reference current generator of claim 10, wherein
    each of the plurality of second TC controllers includes a PMOS transistor, and
    the PMOS transistor is connected to a complementary to absolute temperature (CTAT) current source generating an output current inversely proportional to a temperature.

12. The read reference current generator of claim 9, wherein a sum of the first read reference current and the second read reference currents selected in response to the third control signal determines a maximum bit line current of the selected bit line.

13. The read reference current generator of claim 12, wherein a temperature coefficient and an absolute value of the maximum bit line current are controlled in response to the first control signal, the second control signal, and the third control signal.

14. The read reference current generator of claim 9, wherein a node between the first TC controller and the replica circuit is directly connected to an input terminal of a buffer outputting a clamp voltage.

15. The read reference current generator of claim 14, wherein the plurality of second TC controllers are connected to the input terminal by the plurality of switches.

16. A read reference current generator comprising:
    a temperature coefficient (TC) controller configured to adjust a temperature coefficient in response to a first control signal and generate a first read reference current having an adjusted temperature coefficient;
    a plurality of current sources configured to generate second read reference currents having different absolute values in response to a second control signal;
    a replica circuit configured to determine a voltage level of a selected bit line to a constant voltage level; and
    a plurality of switches configured to control connection of the plurality of current sources and the replica circuit in response to a third control signal.

17. The read reference current generator of claim 16, wherein the second read reference currents have a zero temperature coefficient not changing according to a temperature.

18. The read reference current generator of claim 17, wherein
- each of the plurality of current sources includes a first PMOS transistor and a second PMOS transistor, and
- the first PMOS transistor is connected to a proportional to absolute temperature (PTAT) current source generating a first output current proportional to a temperature, and
- the second PMOS transistor is connected to a complementary to absolute temperature (CTAT) current source generating a second output current inversely proportional to a temperature.

19. The read reference current generator of claim 16, wherein a sum of the first read reference current and the second read reference currents selected in response to the third control signal determines a maximum bit line current of the selected bit line.

20. The read reference current generator of claim 19, wherein a temperature coefficient of the maximum bit line is adjusted in response to the first control signal and an absolute value of the maximum bit line current is adjusted in response to the second control signal and the third control signal.

* * * * *